(12) United States Patent
Hu et al.

(10) Patent No.: US 7,126,822 B2
(45) Date of Patent: Oct. 24, 2006

(54) ELECTRONIC PACKAGES, ASSEMBLIES, AND SYSTEMS WITH FLUID COOLING

(75) Inventors: Chuan Hu, Chandler, AZ (US); Ravi V. Mahajan, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/404,310

(22) Filed: Mar. 31, 2003

(65) Prior Publication Data

US 2004/0190254 A1   Sep. 30, 2004

(51) Int. Cl.
*H05K 7/20* (2006.01)

(52) U.S. Cl. ............ 361/699; 361/689; 361/698; 361/700; 257/714; 257/715; 165/80.4; 174/15.1

(58) Field of Classification Search ........ 361/698–700, 361/704, 705, 689, 690; 257/706, 712, 714, 257/715; 174/15.1, 15.2; 165/80.4, 104.26, 165/185, 104.33
See application file for complete search history.

(56) References Cited

U.S. PATENT DOCUMENTS

| | | | |
|---|---|---|---|
| 5,250,843 A * | 10/1993 | Eichelberger ............ 257/692 |
| 5,625,227 A | 4/1997 | Estes et al. |
| 5,696,405 A | 12/1997 | Weld |
| 5,763,951 A * | 6/1998 | Hamilton et al. ........... 257/714 |
| 6,101,715 A * | 8/2000 | Fuesser et al. ........... 29/890.03 |
| 6,388,317 B1 * | 5/2002 | Reese ........................ 257/713 |
| 6,501,654 B1 | 12/2002 | O'Connor et al. |
| 6,631,077 B1 * | 10/2003 | Zuo ........................... 361/699 |
| 6,665,180 B1 | 12/2003 | Lehman et al. |
| 6,943,444 B1 * | 9/2005 | von Gutfeld et al. ....... 257/714 |
| 2002/0039280 A1 | 4/2002 | O'Connor et al. |
| 2002/0043716 A1 | 4/2002 | Miller |
| 2002/0196604 A1 | 12/2002 | Lehman et al. |
| 2004/0190252 A1 * | 9/2004 | Prasher et al. ............. 361/699 |
| 2006/0108097 A1 * | 5/2006 | Hodes et al. .............. 165/80.4 |

FOREIGN PATENT DOCUMENTS

| WO | WO-0210661 A1 | 2/2002 |
|---|---|---|
| WO | WO-02050901 A2 | 6/2002 |
| WO | WO-04095575 A2 | 11/2004 |

OTHER PUBLICATIONS

Kirshberg, Jeffrey, et al., "Cooling Effect of a MEMS Based Micro Capillary Pumped Loop for Chip-Level Temperature Control", *ASME*, (2000), 8 pages.

Laser, Daniel, et al., "A Micromachined Silicon Low-Voltage Parallel-Plate Electrokinetic Pump", *11th International Conference on Solid-State Sensors and Actuators*, Transducers '01, Eurosensors XV, (Jun. 10, 2001), 920-923.

(Continued)

*Primary Examiner*—Boris Chervinsky
(74) *Attorney, Agent, or Firm*—Schwegman, Lundberg, Woessner & Kluth, P.A.

(57) ABSTRACT

To accommodate high power densities associated with high-performance integrated circuits, an integrated circuit (IC) package includes a heat-dissipating structure in which heat is dissipated from a surface of one or more dice to a heat spreader. The heat spreader has a fluid-conducting channel formed therein, and a fluid coolant may be circulated through the channel via a micropump. In an embodiment, the channel is located at or near a surface of the heat spreader, and a heat-generating IC is in thermal contact with the heat spreader. In an embodiment, the IC is a thinned die that is coupled to the heat spreader via a thinned thermal interface material. Methods of fabrication, as well as application of the package to an electronic assembly and to an electronic system, are also described.

29 Claims, 7 Drawing Sheets

OTHER PUBLICATIONS

Zeng, Shulin, et al., "Fabrication and Characterization of Electrokinetic Micro Pumps", *2000 Inter Society Conference on Thermal Phenomena*, (2000), 31-36.

Zeng, Shulin, et al., "Fabrication and Characterization of Electroosmotic Micropumps", *Elsevier Sensors and Actuators B Chemical*, (2001), 107-114.

* cited by examiner

ELECTRONIC PACKAGES, ASSEMBLIES, AND SYSTEMS WITH FLUID COOLING

RELATED APPLICATION

This application is related to the following application, which is assigned to the same assignee as the present application:

(1) Ser. No. 10/036,389, entitled "Thinned Die Integrated Circuit Package", now issued as U.S. Pat. No. 6,841,413.

TECHNICAL FIELD

The subject matter relates generally to electronics packaging and, more particularly, to an electronics package with fluid cooling, and to methods related thereto.

BACKGROUND INFORMATION

An integrated circuit ("IC") die may be assembled into an IC package. One or more IC packages may be physically and electrically coupled to another packaging element, such as a printed circuit board ("PCB") and/or a heat spreader to form an "electronic assembly". The "electronic assembly" may be part of an "electronic system". An "electronic system" is broadly defined herein as any product comprising an "electronic assembly". Examples of electronic systems include computers (e.g., server, router, desktop, laptop, hand-held, Web appliance, etc.), wireless communications devices (e.g., cellular phone, cordless phone, pager, computer with wireless network, etc.), computer-related peripherals (e.g., printer, scanner, monitor, wireless network card, etc.), entertainment devices (e.g., television, radio, stereo, tape and compact disc players, video cassette recorder, camcorder, digital camera, MP3 (Motion Picture Experts Group, Audio Layer 3) player, etc.), and the like.

In the field of electronic systems there is competitive pressure among manufacturers to drive the performance of their equipment up while driving down production costs. This is particularly true regarding the packaging of IC's, where each new generation of packaging may provide increased performance, particularly in terms of an increased number of components and higher clock frequencies, while generally being smaller or more compact in size. As the internal circuitry of IC's, such as processors, operates at higher and higher clock frequencies, and as IC's operate at higher and higher power levels, the amount of heat generated by such IC's may increase their operating temperature to unacceptable levels. However, the performance and reliability of IC's may diminish as the temperature to which they are subjected increases, so it becomes increasingly important to adequately dissipate heat from IC environments, including IC packages.

For the reasons stated above, and for other reasons stated below which will become apparent to those skilled in the art upon reading and understanding the present specification, there is a significant need in the art for apparatus and methods for packaging an IC that minimize heat dissipation problems associated with high clock frequencies and high power densities.

DETAILED DESCRIPTION

In the following detailed description of embodiments of the subject matter, reference is made to the accompanying drawings that form a part hereof, and in which is shown by way of illustration specific preferred embodiments in which the subject matter may be practiced. These embodiments are described in sufficient detail to enable those skilled in the art to practice the subject matter, and it is to be understood that other embodiments may be utilized and that structural, mechanical, compositional, electrical, and procedural changes may be made without departing from the spirit and scope of the subject matter. The following detailed description is, therefore, not to be taken in a limiting sense, and the scope of the subject matter is defined only by the appended claims.

The subject matter provides a solution to thermal dissipation problems that may be associated with prior art packaging of IC's that have high circuit density and that operate at high clock speeds and high power levels, by employing a high capacity heat spreader in thermal contact with one or more IC's. Various embodiments are illustrated and described herein.

In an embodiment, a back surface of an IC die may be coupled to a heat spreader having a fluid-conducting channel formed therein. A fluid coolant may be circulated through the channel via a suitable pump, such as a micropump. In an embodiment, the channel is located at or near a surface of the heat spreader. In another embodiment the channel is located within the heat spreader and away from its outer surfaces. In an embodiment, the IC is a thinned die that is coupled to the heat spreader via a thinned thermal interface material. Methods of fabrication, as well as application of the package to an electronic assembly and to an electronic system, are also described.

Figure 1:
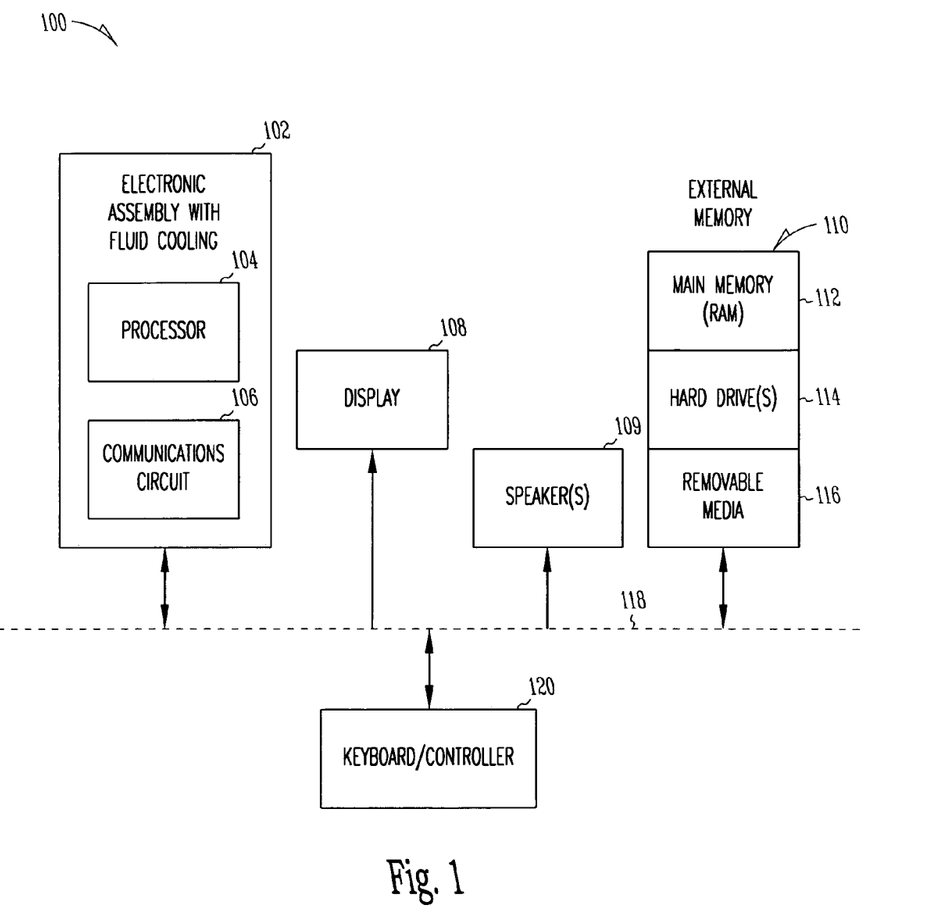
FIG. 1 is a block diagram of an electronic system incorporating at least one electronic assembly with fluid cooling, in accordance with an embodiment of the subject matter.

FIG. 1 is a block diagram of an electronic system 100 incorporating at least one electronic assembly 102 with fluid cooling, in accordance with an embodiment of the subject matter. Electronic system 100 is merely one example of an electronic system in which the subject matter may be used. In this example, electronic system 100 comprises a data processing system that includes a system bus 118 to couple various components of the system. System bus 118 provides communications links among various components of the electronic system 100 and may be implemented as a single bus, as a combination of busses, or in any other suitable manner.

"Suitable", as used herein, means having characteristics that are sufficient to produce the desired result(s). Suitability for the intended purpose can be determined by one of ordinary skill in the art using only routine experimentation.

Electronic assembly 102 is coupled to system bus 118. Electronic assembly 102 may include any circuit or combination of circuits. In an embodiment, electronic assembly 102 includes a processor 104 which may be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), or any other type of processor or processing circuit.

Other types of circuits that may be included in electronic assembly 102 are a custom circuit, an application-specific integrated circuit (ASIC), or the like, such as, for example, one or more circuits (such as a communications circuit 106) for use in wireless devices like cellular telephones, pagers, portable computers, personal digital assistants, two-way radios, and similar electronic systems. The IC may perform any other type of function.

Electronic system 100 may also include an external memory 110, which in turn may include one or more memory elements suitable to the particular application, such as a main memory 112 in the form of random access memory (RAM), one or more hard drives 114, and/or one or more drives that handle removable media 116 such as floppy diskettes, compact disks (CDs), digital video disks (DVD), and the like. In an embodiment, main memory 112 comprises dynamic random access memory IC's. In other embodiments, flash memory IC's, static RAM IC's, and the like could be used in main memory 112.

Electronic system 100 may also include a display device 108, one or more speakers 109, and a keyboard and/or controller 120, which may include a mouse, trackball, game controller, voice-recognition device, or any other device that may permit a system user to input information into and receive information from the electronic system 100.

Figure 2:
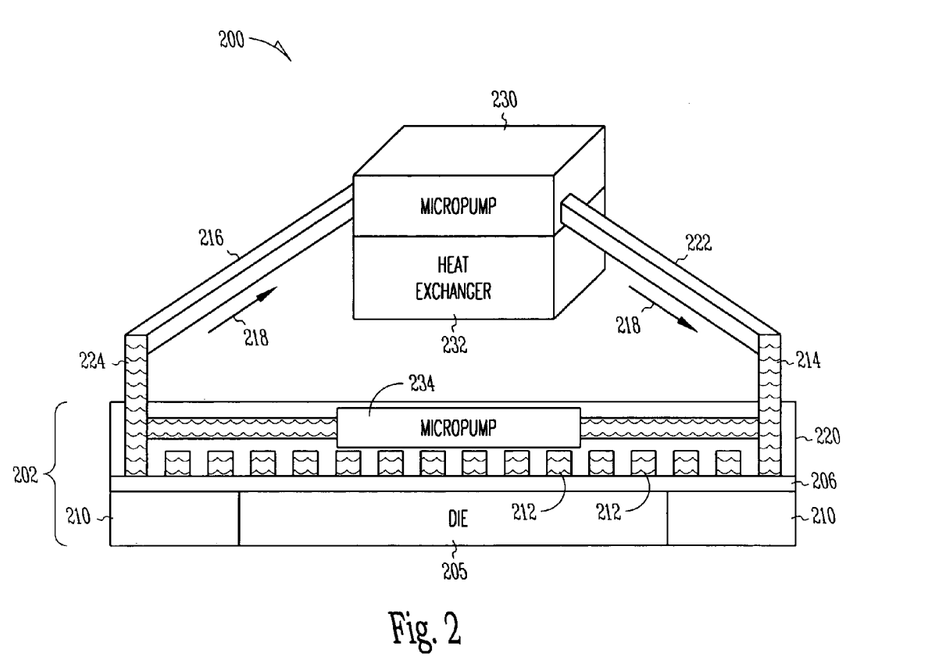
FIG. 2 illustrates a side representation and a partially schematic representation of an electronic assembly comprising an IC package having fluid cooling, in accordance with an embodiment of the subject matter.

FIG. 2 illustrates a side representation and a partially schematic representation of an electronic assembly 200 comprising an IC package 202 having fluid cooling, in accordance with an embodiment of the subject matter.

In the example shown in FIG. 2, an electronic assembly 200 comprises an IC package 202. IC package 202 may comprise a die 205 coupled to a heat spreader 220 via a thermal interface material 206. In an embodiment, die 205 may comprise a processor; in another embodiment the die may comprise a different kind of heat-generating component, such as an ASIC, amplifier, and the like. In an embodiment, one or more heat-generating discrete components, such as a resistor, capacitor, inductor, and the like, may be substituted for die 205. In an embodiment, multiple dice may be coupled to heat spreader 220.

Heat spreader 220 may comprise a fluid-conducting channel 212 formed therein. Heat spreader 220 may have a thickness in the range of approximately 1.5–6 mm. In an embodiment, heat spreader 220 may have a thickness of approximately 3 mm.

In an embodiment, a suitable fluid is circulated through channel 212 by a pump, such as micropump 230. The fluid may move in the direction indicated by arrows 218. The output side of micropump 230 may be coupled via supply pipe 222 and intake pipe 214 to channel 212 of heat spreader 220. An outlet pipe 224 and a removal pipe 216 may couple channel 212 to the intake side of micropump 230. In FIG. 2, micropump 230, supply pipe 222, and removal pipe 216 are illustrated schematically, and they may be physically located in any suitable place, either inside or outside the IC package 202.

In an embodiment, a micropump 234 may be formed as part of the heat spreader 220 and/or integrated into it. Micropump 234 may serve in place of or in addition to micropump 230.

Micropumps 230 and 234 may be of any suitable type. For example, micropumps 230 and 234 may be of the membrane-displacement type, such as piezoelectric, electrostatic, thermopneumatic, electromagnetic, photothermal, and the like. They may also be field-induced flow pumps, such as electrokinetic, electroosmotic, electrohydrodynamic, magnetohydrodynamic, and the like. Alternatively, any suitable mechanical pump, such as but not limited to an impeller, rotary, reciprocating, or screw pump, may be used.

The fluid circulating through channel 212 may be of any suitable type, such as deionized water or acetonitrile. Either a one-phase system or a two-phase system may be utilized. In a one-phase system, the fluid may remain essentially a liquid as it travels through the system. In a two-phase system, a two-phase fluid partially changes into a vapor as it moves through a portion of the system, and it changes back to a liquid as it moves through another portion of the system. In an example of a two-phase embodiment, an incoming liquid may become partially vaporized as a two-phase fluid as it passes through channel 212 and absorbs heat from the die 205, and the fluid may condense back to a liquid as it passes through a condenser or heat exchanger 232 or is otherwise cooled.

In an embodiment, micropump 230 and/or micropump 234 are electrokinetic pumps. In general, micropumps of the types mentioned above, including electrokinetic pumps, may offer the advantages of having relatively simple architecture, no moving parts, low power consumption, and relatively high reliability.

Micropump 230 and/or micropump 234 may be fabricated in any suitable way and from any suitable material. For example, they may be micro-machined using known Micro Electro Mechanical Systems ("MEMS") techniques. They may be fabricated from silicon. As mentioned above, micropump 234 may be fabricated within heat spreader 220.

In an embodiment, multiple micropumps may be provided for electronic assembly 200, and they may be operated in series or in parallel. If desired, a suitable heat exchanger 232 may be coupled into the fluid cooling system to further dissipate heat.

Heat spreader 220 may comprise any suitable material, such as copper, copper alloys including copper alloys with tungsten, copper laminates, molybdenum, molybdenum laminates, molybdenum alloys, aluminum, aluminum alloys including metallized aluminum nitride, beryllium oxide, diamond, ceramic, and the like.

In the example shown in FIG. 2, a thinned die 205 may be used. Die 205 may have a thickness, for example, in the range of 20–300 μm. In an embodiment, die 205 has a thickness not exceeding 100 μm.

In the example shown in FIG. 2, a thinned thermal interface material 206 may be used. Thermal interface material 206 may have a thickness, for example, in the range of 1 to 100 μm. In an embodiment, thermal interface material 206 has a thickness of approximately 6 μm.

Thermal interface material 206 may comprise any suitable material, such as lead, nickel, vanadium, tin, indium, gallium, bismuth, cadmium, zinc, copper, gold, silver, antimony, germanium, and alloys thereof. In an embodiment, thermal interface material 206 comprises an alloy of approximately 80% gold, 20% tin, and a trace amount of nickel (e.g. less than 1%). In an embodiment, thermal interface material 206 comprises a hard solder having a melting temperature above 280 degrees Centigrade and a tensile strength of exceeding 40,000 pounds per square inch. However, in other embodiments, a different minimum melting temperature and tensile strength could be selected. For example, in an embodiment, the thermal interface material 206 may comprise material having a tensile strength exceeding 4,000 pounds per square inch.

The above-referenced "Related Application" discloses various embodiments of component packaging utilizing thinned dies and thinned thermal interface materials. IC packages based upon the inventive concepts in the "Related Application" may have significant advantages in terms of ease of fabrication, yield, and reliability, and they may also provide a reduced thermal resistance between heat-generating areas and heat-dissipating areas of the packages.

In the example shown in FIG. 2, the die 205, to which the heat spreader 220 is coupled, does not overlap or underlie the entire channel 212. That is, the die 205 has a geometry of a first size; the channel 212 has a geometry of a second size; and the second size is greater than the first size. In this example, a core element 210 may be used to overlap the portion of the channel 212 that is not overlapped by the die 205. In this example, the core element 210 is shown laterally adjacent to the die 205. The core element 210 may be formed of any suitable material, such as a plastic, a metal, a ceramic, and the like. The core element 210 may assist in covering, sealing, protecting, and/or stiffening the portion of channel 212 that is not overlapped by die 205. Channel 212 may otherwise lack adequate sealing, protection, and stiffening, because the thermal interface material 206 may be very thin, as mentioned above.

Figure 3:
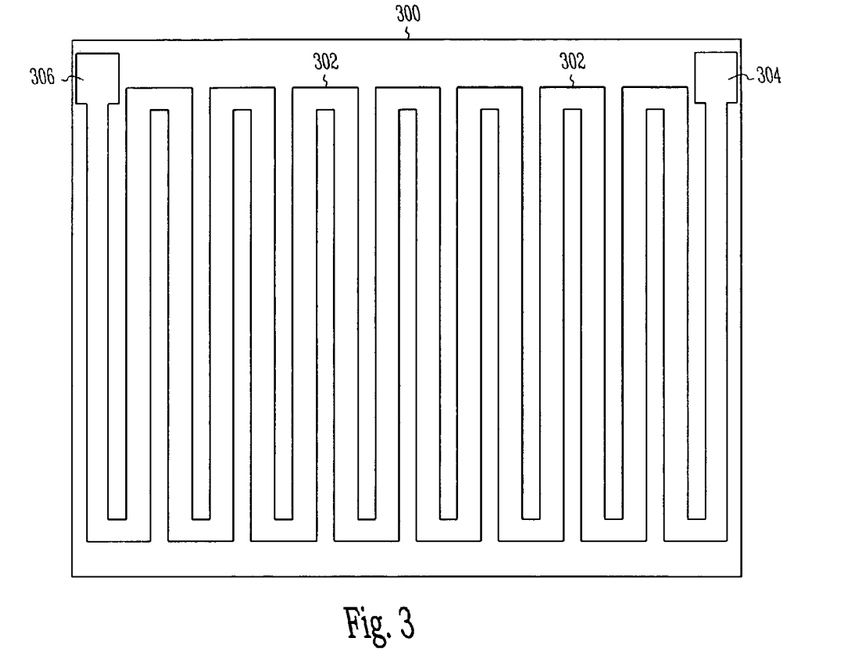
FIG. 3 illustrates a top representation of a heat spreader having a serpentine fluid-conducting channel therein, in accordance with an embodiment of the subject matter.

FIG. 3 illustrates a top representation of a heat spreader 300 having a serpentine fluid-conducting channel 302 therein, in accordance with an embodiment of the subject matter. Channel 302 may comprise an inlet area 304 and an outlet area 306 to couple to corresponding pipes, hoses, supply channels, and the like.

In this example, channel 302 makes a serpentine path from a first side of heat spreader 300, e.g. the right-hand side as shown in FIG. 3, to a second side of heat spreader 300, e.g. the left-hand side of FIG. 3.

Any other suitable geometry for channel 302 may be used, including but not limited to a plurality of parallel channels, one or more chambers, and/or any combination of channel geometries. In general, the channel geometry may be selected to provide relatively more heat transfer from those portions of the die that generate relatively more heat than other portions of the die.

The cross-section of channel 302 may be of any suitable geometry. In an embodiment, channel 302 has a square cross-section of approximately 50 μm per side. The width of channel may be in the range of 20 to 1000 μm.

Figure 4:
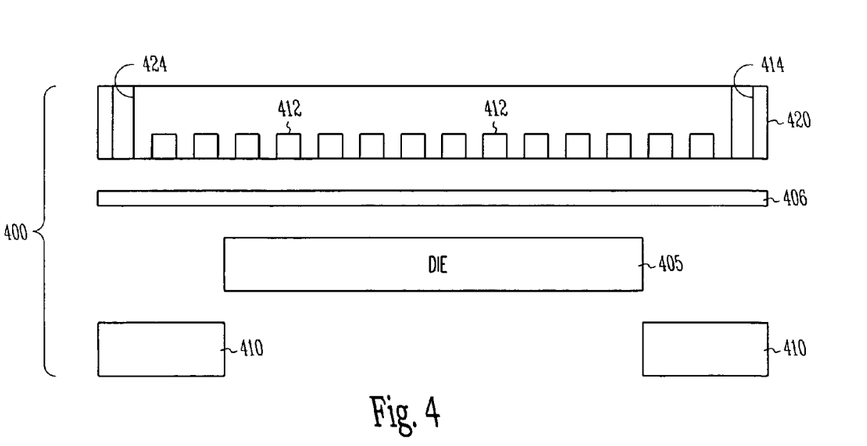
FIG. 4 illustrates a side, exploded representation of an IC package comprising a heat spreader with a fluid-conducting channel therein, in accordance with an embodiment of the subject matter.

FIG. 4 illustrates a side, exploded representation of an IC package 400 comprising a heat spreader 420 with a fluid-conducting channel 412 therein, in accordance with an embodiment of the subject matter. IC package 400 may be similar to, identical to, or different from IC package 202 shown in FIG. 2.

IC package 400 comprises a heat spreader 420 with a fluid-conducting channel 412, which may be of a serpentine geometry, and which may be coupled between an inlet chamber 414 and an outlet chamber 424. In this embodiment, channel 412 is formed in a bottom surface (as viewed in FIG. 4) of heat spreader 420.

IC package 400 further comprises a thermal interface material 406, which may be thinned, as mentioned earlier. In addition, IC package 400 comprises die 405, which may also be thinned. Further, one or more core elements 410 may be provided to cover the portions of channel 412 and of thermal interface material 406 that are not covered by die 405. In an embodiment, core element 410 may comprise a single O-shaped element that surrounds die 405; however, in other embodiments, core element 410 may comprise other geometries, such as strips, L-shaped segments, one or more C-shaped segments, and the like.

Figure 5:
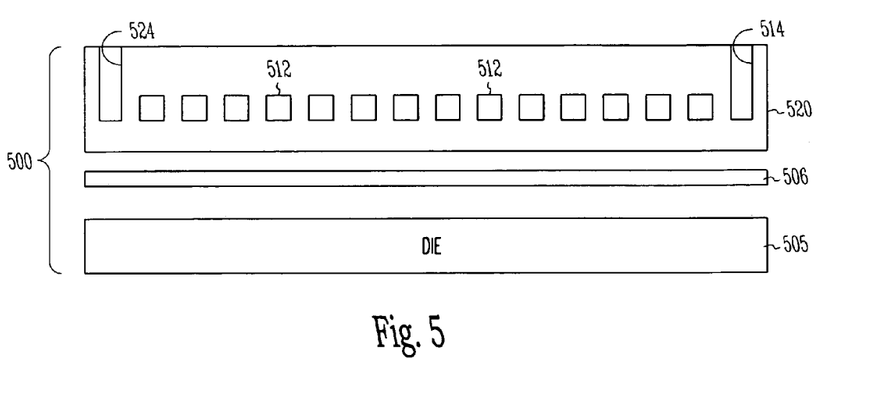
FIG. 5 illustrates a side, exploded representation of an IC package comprising a heat spreader with a fluid-conducting channel therein, in accordance with an embodiment of the subject matter.

FIG. 5 illustrates a side, exploded representation of an IC package 500 comprising a heat spreader 520 with a fluid-conducting channel 512 therein, in accordance with an embodiment of the subject matter.

IC package 500 comprises a heat spreader 520 with a fluid-conducting channel 512, which may be of a serpentine geometry, and which may be coupled between an inlet chamber 514 and an outlet chamber 524. In this embodiment, channel 512 is formed within the interior of heat spreader 520, i.e. relatively distant from the top and bottom surfaces of heat spreader 520. One of ordinary skill in the art may determine without undue experimentation suitable locations for channel 512 within the interior of heat spreader 520.

IC package 500 further comprises a thermal interface material 506, which may be thinned, as mentioned earlier. In addition, IC package 500 comprises die 505, which may also be thinned. In this embodiment, it will be noted that core elements, such as core element(s) 410 (refer to FIG. 4), are unnecessary, because the die overlaps substantially the entire thermal interface material 506.

Figure 6:
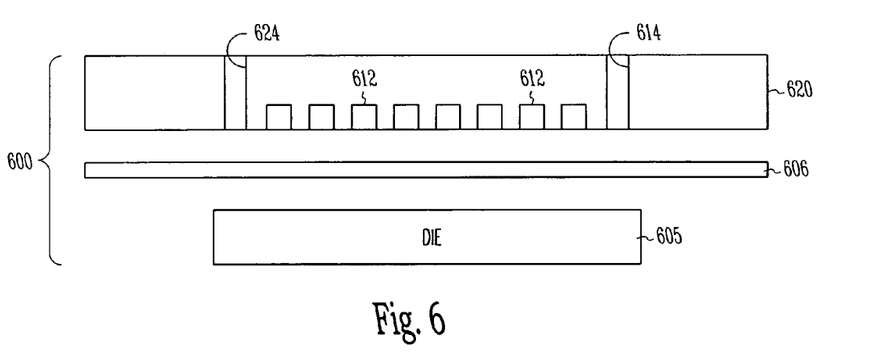
FIG. 6 illustrates a side, exploded representation of an IC package comprising a heat spreader with a fluid-conducting channel therein, in accordance with an embodiment of the subject matter.

FIG. 6 illustrates a side, exploded representation of an IC package 600 comprising a heat spreader 620 with a fluid-conducting channel 612 therein, in accordance with an embodiment of the subject matter.

IC package 600 comprises a heat spreader 620 with a fluid-conducting channel 612, which may be of a serpentine geometry, and which may be coupled between an inlet chamber 614 and an outlet chamber 624. In this embodiment, channel 612 is formed at or very near the bottom surface of heat spreader 620.

IC package 600 further comprises a thermal interface material 606, which may be thinned, as mentioned earlier. In addition, IC package 600 comprises die 605, which may also be thinned.

In this embodiment, it will be noted that the width of die 605 is less than that of heat spreader 620. Also, the width of the area occupied by channel 612 is less than that of die 605. The width of thermal interface 606 may be the same as that of heat spreader 620, or it could be different from that of heat spreader 620, e.g. the same width as that of die 605. Core elements, such as core element(s) 410 (refer to FIG. 4), may be unnecessary, because the die overlaps substantially the entire width of the area occupied by channel 612; however, one or more core elements could be used in this embodiment, if desired.

FIGS. 7, 8, 9, and 10 together illustrate a method of fabricating an IC package comprising a heat spreader 700 with a fluid-conducting channel 702 therein, in accordance with an embodiment of the subject matter.

Figure 7:
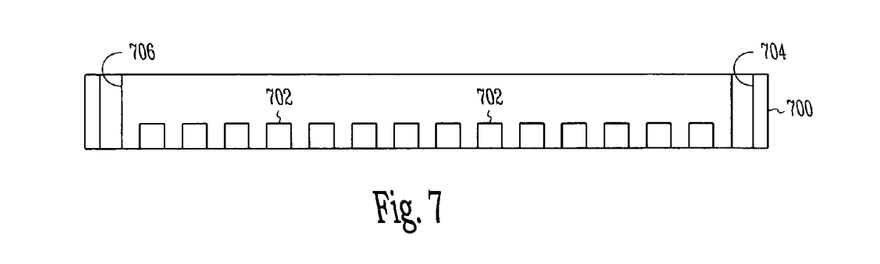
FIGS. 7, 8, 9, and 10 together illustrate a method of fabricating an IC package comprising a heat spreader with a fluid-conducting channel therein, in accordance with an embodiment of the subject matter.

FIG. 7 illustrates a side view of a heat spreader 700 formed of any suitable material, such as those mentioned earlier. In an embodiment, heat spreader 700 is formed of copper.

Channel 702 may be fabricated in any suitable manner, e.g. by micro-machining, punching, etching, scribing, drilling, and the like. In an embodiment, a plurality of grooves may be formed in the bottom surface of heat spreader 700. In addition, an inlet via or chamber 704 and an outlet via or chamber 706 may be formed in heat spreader 700.

Figure 8:
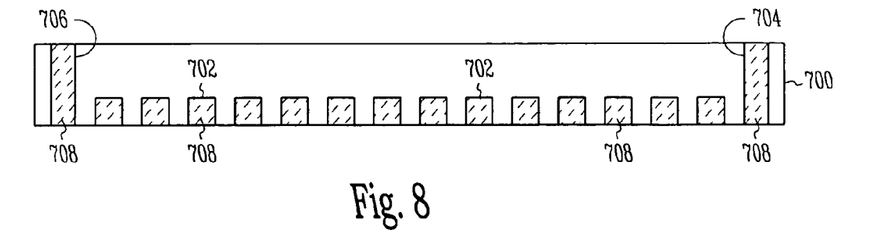

FIG. 8 illustrates a side view of heat spreader 700 following the application of a filler material 708 to the channel 702 and to the inlet and outlet chambers 704 and 706, respectively. Filler material 708 may be applied and polished to assist in preparing a suitable bonding surface on the bottom surface of heat spreader 700. Filler material 708 may comprise a material that can be dissolved at relatively low temperature using a suitable solvent. In an embodiment, filler material 708 may comprise a photoresist material. In another embodiment filler material 708 may comprise a wax that is soluble in water and/or acetone.

Figure 9:
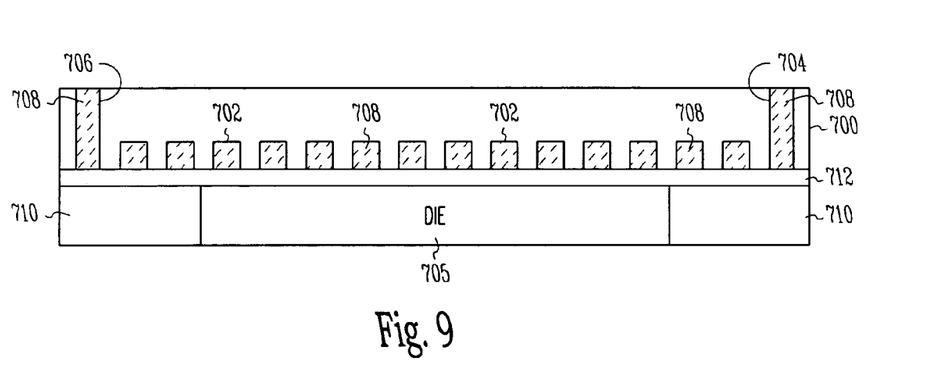

FIG. 9 illustrates a side view of heat spreader 700 following attachment of a thermal interface material 712 to the bottom surface. Also illustrated in FIG. 9 are die 705 and core element(s) 710, which have been attached to thermal interface material 712. Filler material 708 still remains within channel 702 and within the inlet and outlet chambers 704 and 706, respectively.

Thermal interface material 712 may be formed on the bottom surface of heat spreader 700. In an embodiment, the bottom surface of heat spreader 700 may have a layer of Ni formed on it through any suitable technique. A layer of Au may be formed over the layer of Ni, and a layer of Sn may be formed over the layer of Ni.

Prior to attachment of die 705 to thermal interface material 712, the back side of die 705 may be suitably coated with one or more layers of metal, as necessary, to promote adhesion, to provide a diffusion barrier, to inhibit oxidation, and so forth. For adhesion, Ti or TiN may be used. For a diffusion barrier, Ni or NiV may be used. To inhibit oxidation, Au, Pt, or Ag may be used. In an embodiment, die 705 may have a layer of Ni, followed by a layer of Au.

To couple die 705 to heat spreader 700, die 705 and heat spreader 700 are subjected to a suitable amount of heat to cause the thermal interface material 712 to melt. In an embodiment wherein the thermal interface material 712 comprises Au, Ni, and Sn, and the die 705 comprises a layer of Au over a layer of Ni, the Au may begin diffusing into the Sn around 230 C. Within the range of approximately 280–310 C the Ni may diffuse into the Au/Sn alloy. In this embodiment, the Au/Sn alloy may be approximately 80% Au and 20% Sn by weight, and it may contain a trace amount of inter-diffused Ni at the interface between the die 705 and the thermal interface material 712, as well as at the interface between the thermal interface material 712 and the heat spreader 700. In other embodiments, different materials may be substituted for those described.

Figure 10:
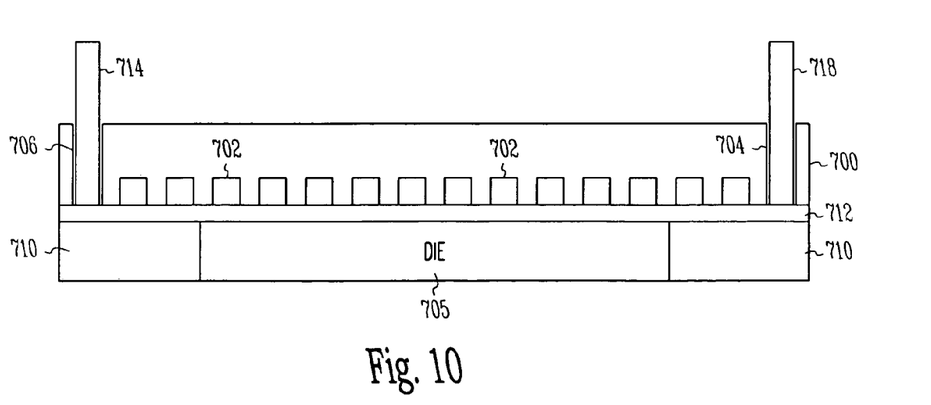

FIG. 10 illustrates a side view of heat spreader 700 after filler material 708 has been removed from channel 702 and from the inlet and outlet chambers 704 and 706, respectively. In addition, an inlet pipe 718 has been inserted into inlet chamber 704, and an outlet pipe 714 has been inserted into outlet chamber 706. Inlet pipe 718 and outlet pipe 714 may or may not be necessary, depending upon how channel 702 is coupled to a suitable pump (not illustrated in FIG. 10).

Figure 11:
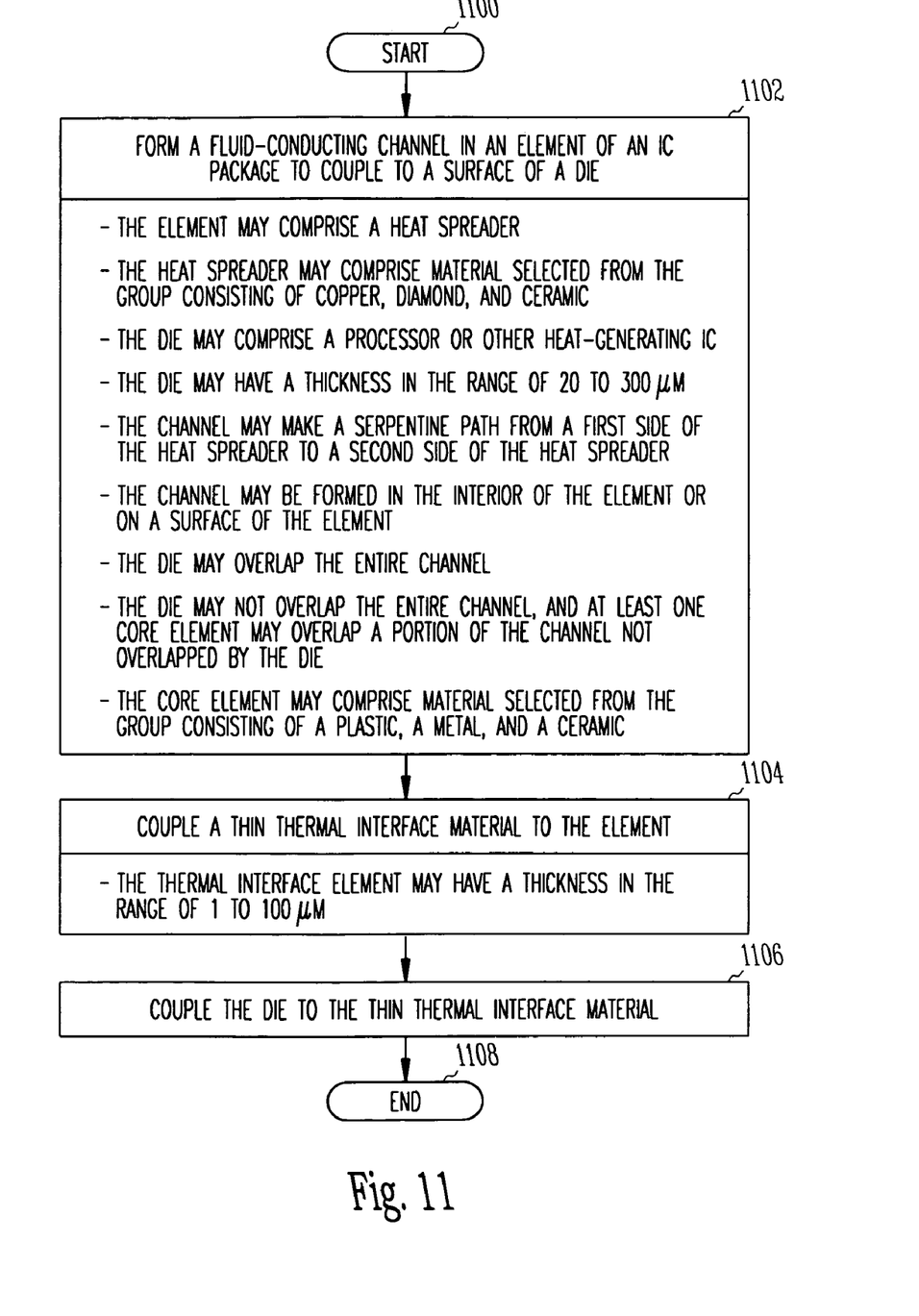
FIG. 11 is a flow diagram of several methods of fabricating an IC package comprising a heat spreader with a fluid-conducting channel therein, in accordance with various embodiments of the subject matter.

FIG. 11 is a flow diagram of several methods of fabricating an IC package comprising a heat spreader with a fluid-conducting channel therein, in accordance with various embodiments of the subject matter. The methods start at 1100.

In 1102, a fluid-conducting channel is formed in an element of an IC package that is to be coupled to a surface of one or more heat-generating components, such as one or more semiconductor dice. The package element may comprise a heat spreader. The heat spreader may comprise material selected from the group consisting of copper, copper alloys including copper alloys with tungsten, copper laminates, molybdenum, molybdenum laminates, molybdenum alloys, aluminum, aluminum alloys including metallized aluminum nitride, beryllium oxide, diamond, and ceramic.

The heat-generating component may be a die. The die may comprise a processor or other heat-generating IC. The die may be a thinned die. In an embodiment, the die may have a thickness in the range of 50 to 150 µm; in an embodiment the die has a thickness not exceeding 100 µm.

The channel may make a serpentine path from a first side of the heat spreader to a second side of the heat spreader. The channel may be formed in the interior of the heat-spreading element or on or near a surface of the element.

In an embodiment, the die may overlap the entire channel. In an embodiment, the die may not overlap the entire channel, and at least one core element may overlap a portion of the channel that is not overlapped by the die. The core element(s) may comprise a material selected from the group consisting of a plastic, a metal, and a ceramic.

In 1104, a thermal interface material is coupled to the heat-spreading element. In an embodiment, the thermal interface material may be thinned. In an embodiment, the thermal interface material may have a thickness in the range of 5 to 20 µm.

In 1106, the die is coupled to the thermal interface material. The methods end at 1108.

Figure 12:
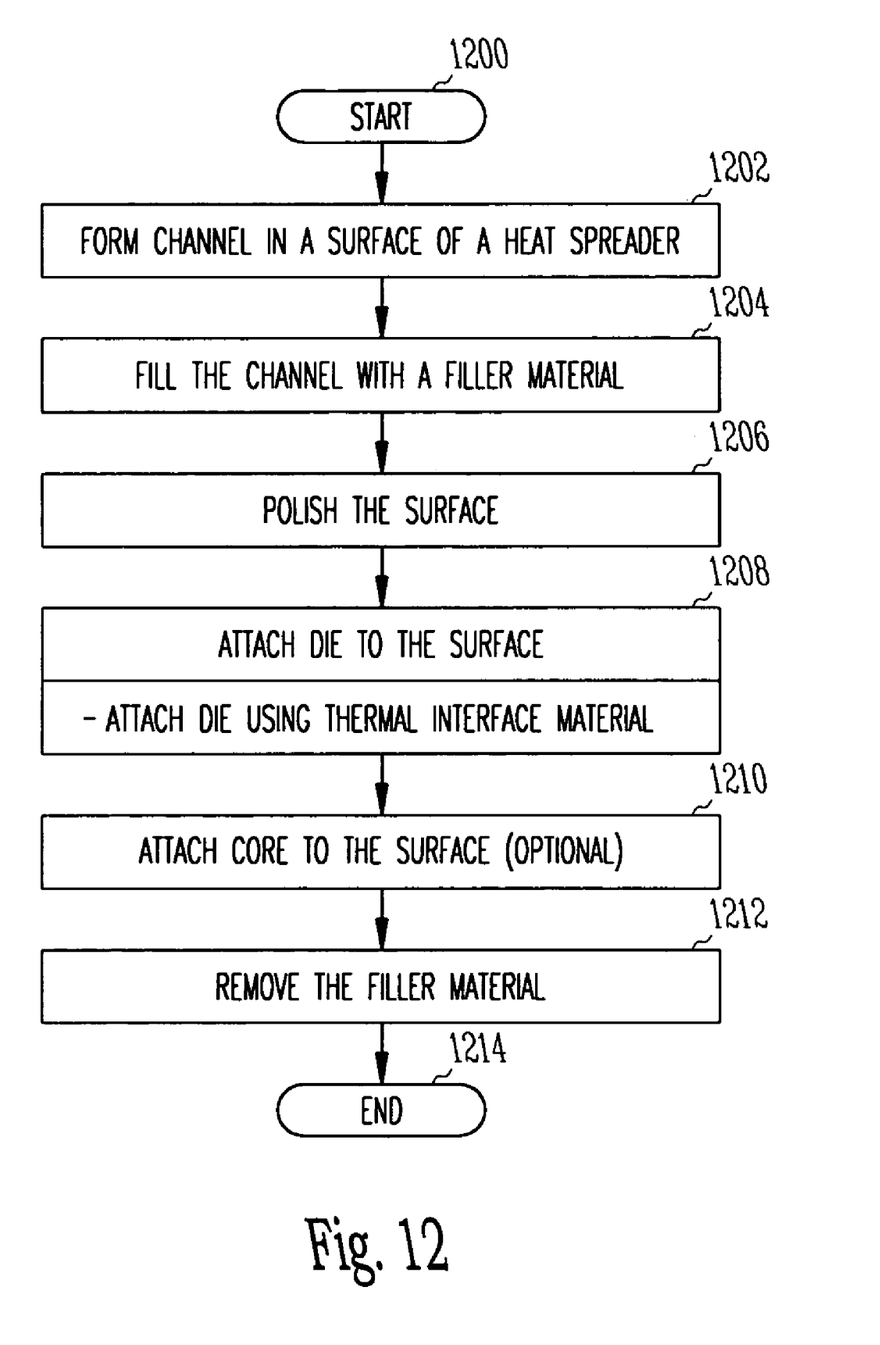
FIG. 12 is a flow diagram of a method of fabricating a heat spreader with a fluid-conducting channel therein, in accordance with an embodiment of the subject matter.

FIG. 12 is a flow diagram of a method of fabricating a heat spreader with a fluid-conducting channel therein, in accordance with an embodiment of the subject matter. The methods start at 1200.

In 1202, a channel is formed in a surface of a heat spreader. The channel may be formed in any suitable manner, including any technique described herein.

In 1204, the channel is filled with a suitable filler material.

In 1206, the surface is polished.

In 1208, the die is attached to the surface of the heat spreader. The die may be attached using a thermal interface material. In an embodiment, a thinned die and a thinned thermal interface material are used.

In 1210, a core may optionally be attached to the surface, if desired.

In 1212, the filler material is removed. The methods end at 1214.

The operations described above with respect to the methods illustrated in FIGS. 11 and 12 may be performed in a different order from those described herein. Although the flow diagrams of FIGS. 11 and 12 show an "End", they may be performed continuously if desired.

The above-described choice of dice, pump(s), thermal interface material, heat spreader material, core material, type of fluid, geometry, dimensions, fabrication operations, and assembly sequencing may all be varied by one of ordinary skill in the art to optimize the yield, reliability, and performance characteristics of the package.

The resulting package is flexible in terms of the orientation, size, number, order, and composition of its constituent elements. Various embodiments of the subject matter may be implemented using various combinations of pump and heat spreader technologies, choice of materials, and fabrication operations, to achieve the advantages of the inventive subject matter. The structure, including types of materials used, dimensions, layout, geometry, and so forth, of the package may be built in a wide variety of embodiments and fabrication methods, depending upon the requirements of the electronic assembly or electronic system of which it forms a part.

FIGS. 1–10 are merely representational and are not drawn to scale. Certain proportions thereof may be exaggerated, while others may be minimized. FIGS. 1–12 are intended to illustrate various embodiments of the subject matter that can be understood and appropriately carried out by those of ordinary skill in the art.

The inventive subject matter provides for an electronic assembly and methods of manufacture thereof that minimize thermal dissipation problems associated with high power delivery. An electronic system and/or data processing system that incorporates one or more electronic assemblies that utilize the subject matter can handle the relatively high power densities associated with high performance integrated circuits, and such systems may therefore be more commercially attractive.

By substantially increasing the thermal dissipation from high performance electronic assemblies, such electronic equipment may be operated at increased clock frequencies. Alternatively, such equipment may be operated at reduced clock frequencies but with lower operating temperatures for increased reliability.

As shown herein, the subject matter may be implemented in a number of different embodiments, including an integrated circuit package, an electronic assembly, an electronic system in the form of a data processing system, and various methods of fabricating an IC package and an electronic assembly. Other embodiments will be readily apparent to those of ordinary skill in the art after reading this disclosure. The elements, materials, geometries, dimensions, and sequence of operations may all be varied to suit particular packaging requirements.

While certain operations have been described herein relative to "upper" and "lower" surfaces, it will be understood that these descriptors are relative, and that they would be reversed if the IC package or electronic assembly were inverted. Therefore, these terms are not intended to be limiting.

The concepts of the subject matter may be applied to any type of IC package or electronic assembly.

Although specific embodiments have been illustrated and described herein, it will be appreciated by those of ordinary skill in the art that any arrangement that is calculated to achieve the same purpose may be substituted for the specific embodiment shown. This application is intended to cover any adaptations or variations of the subject matter. Therefore, it is manifestly intended that embodiments of the subject matter be limited only by the claims and the equivalents thereof.

It is emphasized that the Abstract is provided to comply with 37 C.F.R. §1.72(b) requiring an Abstract that will allow the reader to ascertain the nature and gist of the technical disclosure. It is submitted with the understanding that it will not be used to interpret or limit the scope or meaning of the claims.

In the foregoing Detailed Description, various features are occasionally grouped together in a single embodiment for the purpose of streamlining the disclosure. This method of disclosure is not to be interpreted as reflecting an intention that the claimed embodiments of the subject matter require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

What is claimed is:

1. A package comprising:
    a heat spreader having a surface with a channel formed therein to conduct a fluid;
    a thinned semiconductor die, wherein the die has a geometry of a first size, wherein the channel has a geometry of a second size greater than the first size;
    a thermal interface material coupling the die directly to the surface of the heat spreader; and
    a core element, laterally adjacent to the die, to overlap a portion of the channel not overlapped by the die.

2. The package recited in claim 1, wherein the die comprises a processor.

3. The package recited in claim 1, wherein the die has a thickness in the range of 20–300 µm.

4. The package recited in claim 1, wherein the die has a thickness not exceeding 100 µm.

5. The package recited in claim 1, wherein the thermal interface material comprises a thinned thermal interface material.

6. The package recited in claim 5, wherein the thermal interface material comprises solder having a melting temperature above 260 degrees Centigrade and a tensile strength of at least 4000 pounds per square inch.

7. The package recited in claim 6, wherein the thermal interface material comprises an alloy of gold, tin, and nickel.

8. The package recited in claim 5, wherein the thermal interface material has a thickness in the range of 1 to 100 µm.

9. The package recited in claim 1, wherein the heat spreader comprises material selected from the group consisting of copper, copper alloys including copper alloys with tungsten, copper laminates, molybdenum, molybdenum laminates, molybdenum alloys, aluminum, aluminum alloys including metallized aluminum nitride, beryllium oxide, diamond, and ceramic.

10. The package recited in claim 1, wherein the channel has a width in the range of 20 to 1000 µm.

11. The package recited in claim 1, wherein the fluid comprises a two-phase fluid.

12. The package recited in claim 1, wherein the core element is formed of a plastic, a metal, or a ceramic.

13. The package recited in claim 1, wherein the core element is O-shaped and surrounds the die.

14. The package recited in claim 1, wherein the core element comprises at least one L-shaped element or at least one C-shaped element.

15. The package recited in claim 1, wherein the core element comprises at least one strip.

16. An electronic assembly comprising:
   an integrated circuit package including
      a heat spreader having a surface with a channel formed therein to conduct a fluid;
      a thinned semiconductor die, wherein the die has a geometry of a first size,
   wherein the channel has a geometry of a second size greater than the first size;
      a thermal interface material coupling the die directly to the surface of the heat spreader; and
      a core element, laterally adjacent to the die, to overlap a portion of the channel not overlapped by the die; and
   a pump coupled to the channel to circulate a fluid therein.

17. The electronic assembly recited in claim 16, wherein the pump is one of an electro-kinetic micropump, an electro-osmotic pump, a capillary pump, or a mechanical pump.

18. The electronic assembly recited in claim 16, wherein the pump is integrated into the heat spreader.

19. The electronic assembly recited in claim 16, wherein the core element is formed of a plastic, a metal, or a ceramic.

20. The electronic assembly recited in claim 16, wherein the core element is O-shaped and surrounds the die.

21. The electronic assembly recited in claim 16, wherein the core element comprises at least one L-shaped element or at least one C-shaped element.

22. The electronic assembly recited in claim 16, wherein the core element comprises at least one strip.

23. An electronic system comprising:
   a bus coupling components in the electronic system;
   a display coupled to the bus;
   an external memory coupled to the bus;
   a processor coupled to the bus and having an electronic assembly including at least one integrated circuit package having
      a heat spreader having a surface with a channel formed therein to conduct a fluid;
      a thinned semiconductor die, wherein the die has a geometry of a first size, wherein the channel has a geometry of a second size greater than the first size;
      a thermal interface material coupling the die directly to the surface of the heat spreader; and
      a core element, laterally adjacent to the die, to overlap a portion of the channel not overlapped by the die; and
   a pump coupled to the channel to circulate a fluid therein.

24. The electronic system recited in claim 23, wherein the pump is one of an electro-kinetic micropump, an electro-osmotic pump, a capillary pump, or a mechanical pump.

25. The electronic system recited in claim 23, wherein the external memory comprises dynamic random access memory integrated circuits.

26. The electronic system recited in claim 23, wherein the core element is formed of a plastic, a metal, or a ceramic.

27. The electronic system recited in claim 23, wherein the core element is O-shaped and surrounds the die.

28. The electronic system recited in claim 23, wherein the core element comprises at least one L-shaped element or at least one C-shaped element.

29. The electronic system recited in claim 23, wherein the core element comprises at least one strip.

* * * * *